United States Patent
Querleux et al.

Patent Number: 6,091,241
Date of Patent: *Jul. 18, 2000

[54] DEVICE FOR EXAMINING A VOLUME OF SMALL DEPTH BY NUCLEAR MAGNETIC RESONANCE

[75] Inventors: Bernard Querleux, Le Perreux; Herve Saint-Jalmes, Paris, both of France

[73] Assignee: L'Oreal, Paris, France

[*] Notice: This patent issued on a continued prosecution application filed under 37 CFR 1.53(d), and is subject to the twenty year patent term provisions of 35 U.S.C. 154(a)(2).

[21] Appl. No.: 08/941,734

[22] Filed: Oct. 1, 1997

[30] Foreign Application Priority Data

Oct. 1, 1996 [FR] France .................... 96 11943

[51] Int. Cl.⁷ .................................................. G01V 3/00
[52] U.S. Cl. .................. 324/300; 324/319; 324/320; 324/301; 324/303; 600/417
[58] Field of Search ................... 324/319, 320, 324/301, 300, 303; 600/417

[56] References Cited

U.S. PATENT DOCUMENTS

| | | |
|---|---|---|
| 4,608,991 | 9/1986 | Rollwitz . |
| 4,721,914 | 1/1988 | Fukushima et al. ............ 324/320 |
| 4,857,848 | 8/1989 | Takichi ................................ 324/318 |
| 4,870,363 | 9/1989 | Yassine et al. . |
| 5,304,930 | 4/1994 | Crowley et al. . |
| 5,390,673 | 2/1995 | Kikinis ............................... 600/410 |
| 5,400,786 | 3/1995 | Allis .................................... 128/653 |
| 5,757,186 | 5/1998 | Taicher ............................... 324/303 |

FOREIGN PATENT DOCUMENTS

| | | |
|---|---|---|
| 0 186 998 | 12/1985 | European Pat. Off. . |
| 0 186 998 | 7/1986 | European Pat. Off. . |
| 0 512 345 | 4/1992 | European Pat. Off. . |
| 0 512 345 A1 | 11/1992 | European Pat. Off. . |
| 2 612 641 | 9/1988 | France . |
| 60-24831 | 2/1985 | Japan . |
| 61-122851 | 6/1986 | Japan . |
| 62-106756 | 5/1987 | Japan . |
| 64-20834 | 1/1989 | Japan . |
| 7-79954 | 3/1995 | Japan . |

*Primary Examiner*—Christine K. Oda
*Assistant Examiner*—Brij B. Shrivastav
*Attorney, Agent, or Firm*—Oblon, Spivak, McClelland, Maier & Neustadt, P.C.

[57] ABSTRACT

A device for examining by nuclear magnetic resonance a volume having small depth, including means for creating a static homogeneous magnetic field $B_0$ in which a volume to be examine is positioned, a system for creating magnetic field gradients in three directions of space, and a radio frequency transmission/reception system. The means for creating the static magnetic field $B_0$, the field gradient system, and the radio frequency transmission/reception system are situated on a same side of an open surface, while the volume to be examined is situated on the other side of the surface. The device can be applied to magnetic resonance imaging.

20 Claims, 5 Drawing Sheets

DEVICE FOR EXAMINING A VOLUME OF SMALL DEPTH BY NUCLEAR MAGNETIC RESONANCE

FIELD OF THE INVENTION

The invention is related to a device for examining a volume by nuclear magnetic resonance. The invention is also related, but not exclusively, to imaging and spectroscopy, particularly in the fields of medicine (dermatology), cosmetics, agricultural food production etc. The invention is further related and particularly advantageous for observing surface zones of an object which may be very voluminous and of small depth, for example, examination of skin in vivo. The invention is also advantageous for examining an eye, inner ear, and superficial portions of a brain, as well as any other item of small depth.

Within the meaning of the present invention, the examination of a volume at a shallow depth may range from a surface examination (for example, of a depth of a few mm for an examination of the skin), to a volume at a greater depth (which may range as far as a few cm). The volume of the region to be examined may vary from a few $cm^3$ to a few hundreds of $cm^3$.

DISCUSSION OF THE BACKGROUND

Nuclear Magnetic Resonance (NMR) apparatuses are becoming increasingly important in standard clinical routines. They make it possible, in particular, to display virtually all organs of a human body. Such apparatuses use a static magnetic field created by a magnet whose technology depends primarily on a desired intensity. Magnetic fields created by coils having magnetic field gradients make it possible to locate all points of a volume in space. Radio frequency antennas permit excitation and reception of an NMR signal. Devices combining the above fields and signals make it possible to obtain anatomical images with a spatial resolution of the order of 0.5 mm.

The practical development of these devices has been led mainly from "whole body" apparatuses into which a patient is introduced. A zone of interest to be examined is then positioned at a center of the apparatus which surrounds the patient.

More recently, a new type of machine has appeared which no longer examines the whole of the human body but only specific regions. In this case, a system for generating magnetic fields generally has a limited diameter of access, preventing the entire patient from being introduced, but being nevertheless sufficient for introducing the zone of interest. Such a device is described, for example, in EP-A-176 353. These dedicated machines are used for examining specific zones of relatively small size (knee, wrist, breast etc.). Nevertheless, they cannot be used when it is desired to observe a small zone on an object, or on a body of a greater size, as for example when one wishes to examine a mole on the patient's shoulder. In this case, it is necessary to introduce the patient as a whole into a "whole body" device.

In the two approaches discussed above, a size of systems for generating a main magnetic field, and the magnetic field gradients, as well as a radio frequency transmission/reception system, is directly related to the volume of the patient or of the zone of interest to be examined.

U.S. Pat. No. 4,870,363 describes an apparatus whose system for creating a magnetic field gradient along one spatial direction is entirely situated on a same side of an open surface, while a body to be examined is situated on another side of the open surface. Such a system is integrated into a device of the "whole body" type, wherein there are generated the main magnetic field, and the field gradients in the two other directions, as well as the radio frequency transmission/reception.

Moreover, all the devices referred to above have the drawback of being heavy, bulky and very expensive.

EP-A-0 512 345 describes a method and an apparatus for obtaining imaging by high-resolution and high-speed magnetic resonance. Typically such a device comprises a set of coils for generating a magnetic field, a radio frequency transmission/reception system, and a system of field gradients in three orthogonal directions, all these elements being disposed on the same side of the surface to be examined, in this case the surface of the earth. According to this document, the magnetic field is perpendicular to the surface examined. Such a configuration results in a limited potential of the system, in particular in terms of the size of the device. This is particularly the case when the device has to be used in a doctor's surgery, for example. Besides, the signal measurement is particularly complicated due to a geometry of the reception system.

U.S. Pat. No. 5,390,673 describes a device for imaging by magnetic resonance that suffers mainly from a drawback in that a field gradient is created in only one direction of space. In fact, such a system makes it possible to obtain surface imaging from a non-homogeneous field derived from a homogeneous field combined with a natural gradient in the direction perpendicular to the surface to be examined. The scope of such a system is limited, particularly in terms of image resolution. Moreover, like the device of the preceding document, the magnetic field is perpendicular to the surface to be examined.

Apart from the fact that it uses a magnetic field perpendicular to the surface to be examined, the device described in EP-A-0 186 998 uses the same means for generating the homogeneous magnetic field, as well as the field gradients. With such a device, it is particularly difficult to undertake high-resolution imaging. Moreover, it is also extremely difficult to create field gradients in the three orthogonal spatial directions and to switch over quickly.

In U.S. Pat. No. 4,721,914, the transmission/reception system is constituted by a coil disposed all round the patient's head. However, the device has no magnetic field gradients, and such a device is limited to use in localized spectroscopy.

SUMMARY OF THE INVENTION

Accordingly, one object of the present invention is to provide a novel NMR apparatus, (i) wherein it is no longer necessary to introduce the patient, as a whole or in part, into a closed or semi-closed structure as in the conventional devices, and (ii) which does not have the drawbacks mentioned above with reference to the devices of the prior art, in particular, but not limited to, in terms of size, resolution, speed, reliability, complexity and cost.

It is another object of the present invention is to provide a device whose machine size is no longer related to the anatomical constraints (diameter of the thorax or of the knee) of a patient, but is related solely to the volume of the zone of interest to be examined, independently of the size of the body or other object to which the zone belongs.

Yet another object of the present invention is to provide a compact examination apparatus of relatively low weight and size, thus imparting to it great flexibility, as well as great ease of use, moreover, at a cost lower than that of the conventional devices.

These and other objects are achieved according to the present invention by providing a novel device including means for examining a volume of small depth by nuclear magnetic resonance, comprising means for creating a homogeneous static magnetic field $B_0$ in which the volume to be examined is positioned; a system of field gradients for creating magnetic field gradients in three orthogonal spatial directions; and a radio frequency transmission/reception system; the means for creating the magnetic field $B_0$, the field gradient system and the radio frequency transmission/reception system being situated on a same side of an open surface, while the volume to be examined is situated on another side of the surface.

In accordance with the invention, the magnetic field $B_0$ has a direction parallel to the open surface. With such a configuration, the signal measurement is simplified because of a simplified geometry of the radio frequency transmission/reception system. Such a simplification is particularly substantial when low intensity magnetic fields are used, and substantially reduces the overall cost of the device. Thus, there is obtained a structure which is, in particular, less bulky, less complex, and more economical than the conventional devices mentioned above.

The means for creating a homogeneous magnetic field parallel to the open surface may comprise a permanent magnet formed of a material such as ferrite, or an iron-rare earth alloy, for example, iron-neodymium-boron. Advantageously, the homogeneity of the field may be improved by using a so-called "shimming" system constituted by either surface coils, or several magnetic materials (iron), and/or small permanent magnets.

In accordance with an important characteristic of the present invention, the means for creating the magnetic field $B_0$, the system of the field gradients, and the radio frequency transmission/reception system are situated on the same side of an open surface, while the volume to be examined is situated on the other side of the surface. This open surface designates a surface of the device intended to be positioned opposite the volume to be observed. Within the meaning of the present application an "open surface" is understood to mean a surface, not having any closed contour, capable of surrounding the body or the part of the body to be examined when the body is in the examination position. Thus the object to be examined is not introduced as a whole or in part into a system surrounding it, but is disposed opposite the surface of the device. Typically, such a surface may be created in a planar form. Other surface types are possible, for example, a slightly domed surface, or a surface adapted to a shape of the body, or of a part of the body to be examined.

Magnetic energies stored in a static magnetic field and in a magnetic field gradient are directly related to the volume of the systems generating them. Thus, with weaker operating energies, a device becomes more compact, lightweight, and inexpensive. In fact, the magnetic energy stored in a magnetic field is of the order of $B^2V$, where B represents the intensity of the controlling field and V the volume over which the field in created. Moreover, as described in the publication by Saint Jalmes et al entitled "Design data for efficient axial gradient coils: application to NMR imaging" published in "Magnetic Resonance in Medicine", Vol. 2 p. 245, 1985, the electric power P necessary for the operation of the magnetic field gradients is a function of $G^2D^5/\Delta T$, where G represents the intensity of the gradient of the magnetic field, D the characteristic dimension of the coil, and $\Delta T$ its switching period. Thus at fixed field and gradient intensities, the minimization of the stored and switched energies, makes it necessary to reduce V and D, that is to say, to reduce the volume over which the fields are created.

In one embodiment, the means for creating a homogeneous magnetic field includes a resistive magnet formed by a copper or aluminium wire traversed by an electric current.

In an alternative embodiment, the means for creating a homogeneous magnetic field includes a superconducting magnet. Preferably, the superconducting magnet is kept at a low temperature (typically of the order to 4° K.) for example by means of a helium cryostat. In yet another alternative, on a part of its surface the magnet is directly opposite the zone to be examined.

BRIEF DESCRIPTION OF THE DRAWINGS

A more complex appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
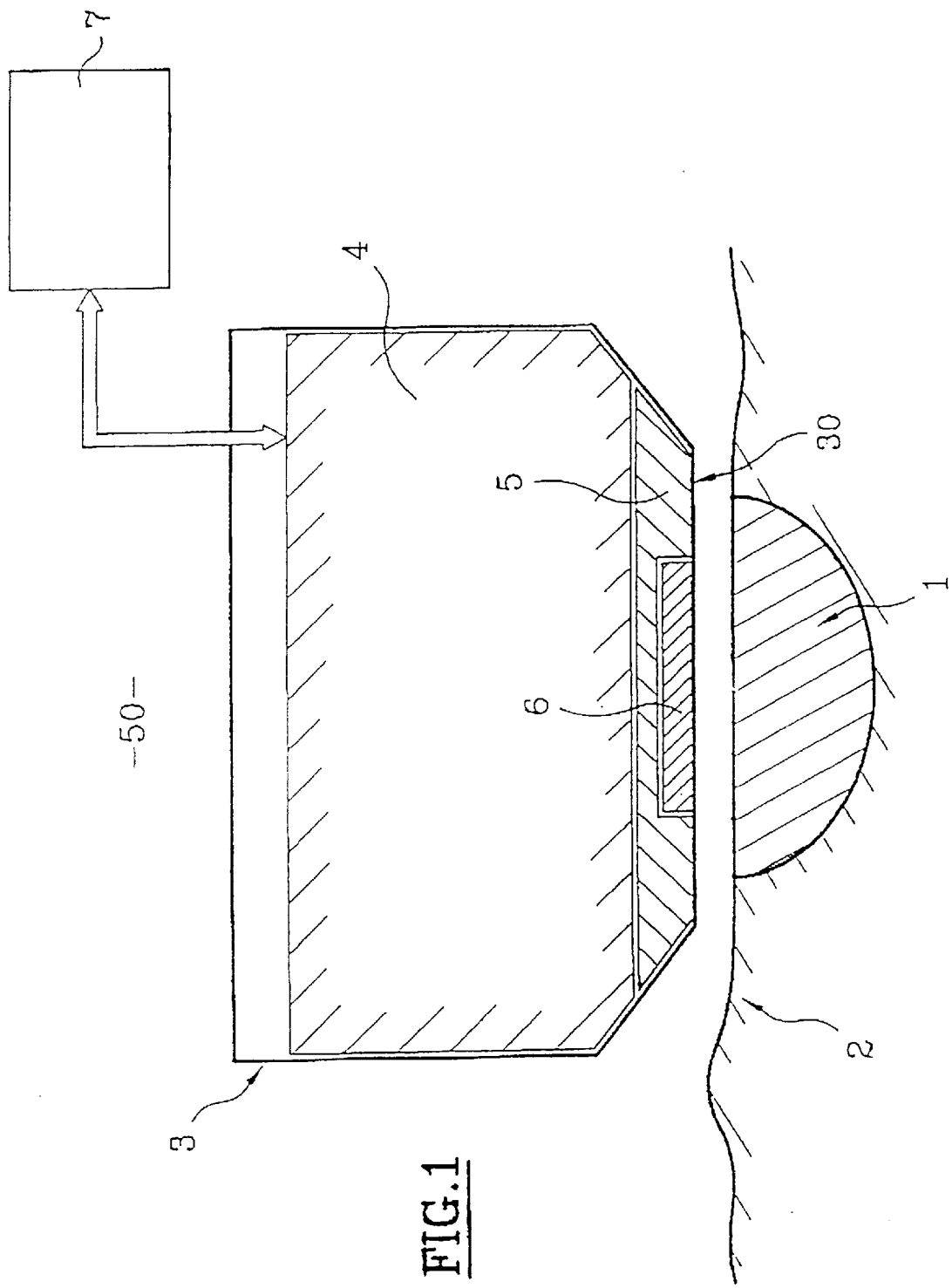
FIG. 1 illustrates a first embodiment of the device in accordance with the invention.

Referring now to the drawings, wherein like reference numerals designate identical or corresponding parts throughout the several views, and more particularly to FIG. 1 thereof, there is illustrated a device which allows a zone 1 to be be examined of a body or larger object 2. Typically, as mentioned above, the volume of such a zone may vary from a few $cm^3$ to some hundreds of $cm^3$, and the depth at which the zone is situated varies from a few mm to several cm. The system in accordance with the invention comprises within a chamber 3 intended to isolate the patient from the system, a surface magnet 4 capable of creating a static magnetic field (main magnetic field) $B_0$ having an intensity and a sufficient uniformity in space to permit imaging and/or spectroscopy over the volume of the zone to be examined.

According to another characteristic of the invention, the magnetic field $B_0$ is parallel to a surface 30 of the chamber 3. The device 50 is positioned opposite the volume 1, the examination being undertaken through the surface 30 of the chamber 3 forming an open surface such as defined above. The technology used for making the magnet of the main magnetic field depends on the intensity of the magnetic field $B_0$, as well as the volume of the zone to be examined.

By way of example, for a magnetic field of less than or equal to 0.3 T, a permanent magnet formed of a material or a mixture of materials such as ferrite, or of an iron-rare earth alloy, for example, iron-neodymium-boron or samarium cobalt will suffice. The channelling of the flux lines may be effected by means of soft iron. For this power range, one will also be able to use a resistive magnet of the type comprising a copper or aluminium wire traversed by an electric current.

On the other hand, for a magnetic field exceeding 0.5 T, a magnet of superconducting type is preferably used. Preferably, the superconducting magnet is contained within a system for keeping it at a temperature which is typically of the order of 4° K. By way of example, a helium cryostat will be used which will be incorporated in the device.

Homogeneity of the magnetic field may be improved by using a so-called "shimming" system (see 21, FIG. 3) disposed, for example, adjacent to a surface magnet (see 20, FIG. 3), and also made in the form of a surface element. Such a system may be active or passive. In the case of an active system, it is constituted by surface coils. In the case of a passive system, it is constituted by magnetic materials and/or permanent magnets.

The device 50 also includes a set of coils 5 making it possible to create magnetic field gradients in three directions of space, and a radio frequency transmission/reception system 6 for transmission and reception of an NMR signal. By way of example, a technology will be used in accordance with that described in U.S. Pat. No. 4,870,363 in which the magnetic field gradient in one direction in space is constituted by a coil comprising at least two windings symmetrical relative to a plane extending perpendicularly to a direction of the main magnetic field $B_0$, each of these windings comprising at least two portions of turns situated in a plane orthogonal to a direction of the main magnetic field, interspaced from one another in the direction of the field, and connected to one another in an appropriate manner. Advantageously, and contrary to some of the conventional devices discussed in the background, the field gradients thus created are substantially collinear with the direction of the field $B_0$.

According to yet another example, the magnetic field gradients in the three orthogonal directions in space are obtained advantageously by means of a configuration in accordance with that described in the thesis for the Doctorate of Science of Mlle. Coeur-Joly defended on the Dec. 8, 1992 and entitled "Module a bobinages de gradients plats tridimensionnels et à antenne refroidie pour l'IRM à haute resolution spatiale" [Module with flat three-dimensional gradient coils and with a cooled antenna for high-resolution spatial MRI (Magnetic Resonance Imaging)] and published in 1993 in the Book of Abstracts, Vol. 3, page 1361 of the Congress of the Society of Magnetic Resonance in Medicine.

Typically, a configuration of a gradient $G_Z$ is such that it offers a field intensity of 80 mT/m for a current of 40 A. Self-inductance measured at 120 Hz is 5.32 mH and resistance measured by injecting a current of 1 A is 446 mΩ. Along a Y axis, a gradient $G_Y$ is 70 mT/m for a current of 40 A. The self-inductance is 1.78 mH at 120 Hz and the resistance is 325 mΩ for 1 A. Along a X axis, a gradient $G_X$ is 35 mT/m for a current of 40 A. The self-inductance is 0.95 mH at 120 Hz and the resistance is 283 mΩ for 1 A. The complete system has a length of 36 cm, a width of 25 cm and a thickness of 6 cm, for a weight of the order of 10 Kg. It has a linearity of an order of 93% for a cubic volume of 4 cm per side.

Yet another example of the field gradient system in the three orthogonal directions in space is described in the article "A novel Type of Surface Gradient Coil" published in the Journal of Magnetic Resonance 94, 471–485. Such a field gradient system is constructed, for example, on an acrylic plate. Windings 22, 23 (see FIGS. 2 and 3) for the gradients ($G_X$, $G_Z$) along the directions X and Z are disposed on one side of the plate, while the winding 24 for the gradient ($G_Y$) along the direction Y is disposed on the other side. All wires are covered by an epoxy resin. By way of example of the geometry, a winding of 20 turns is used for the gradients along the directions X and Y, and 30 turns for the $G_Z$ coil. A diameter of the wire is 0.7 mm for $G_X$ and 0.55 mm for $G_Y$ and $G_Z$.

By way of indication, the coils are formed by an enamelled copper wire. The inductances and resistances are 1.8 mH and 1.5 Ω for $G_X$, 1.6 mH and 1.5 Ω for $G_Y$, 1.2 mH and 1.5 Ω for $G_Z$.

A radio frequency transmission/reception winding 25 may be disposed on the field gradient system, a Faraday shield being disposed between the two, so as to avoid any interactions between the two. Other geometries may be envisaged according to a desired power. According to another embodiment, the coils of the magnetic field gradients are made in the form of a printed circuit.

As far as the radio frequency transmission/reception winding 25 is concerned, it is disposed adjacent to the field gradient coils 22, 23, and 24 opposite the zone to be examined 1. By way of example, such surface antennas are described by ACKERMAN et al., Nature 283, pp 167–170, 1980.

An embodiment particularly suitable for imaging skin, and operating with the magnetic field $B_o$ along the Z axis, is also described in the Radiology Review 1996, pp 457–460 by J. Bittoun, H. Saint Jalmes, B. Querleux et al. However, the publication describes an example that only operates in a receiving mode. Nevertheless, it suffices to eliminate the peak-clipping system constituted by two diodes to allow it to be used also in a transmission mode.

A 3 cm diameter loop antenna is obtained by means of a coaxial copper tube 4 mm in diameter. The antenna is tuned to the resonance frequency by means of an external capacitor. An internal conductor is used to connect the antenna to a preamplifier through a capacitor, while the earth is disposed at a midpoint of the loop. Such a configuration minimizes resistive losses in the antenna, as well as dielectric losses in the patient.

Each of the above elements of the system in accordance with the present invention are controlled by an electronic system associated with a computer-type calculating means 7, whose function is also to acquire and process signals and to form an image or a spectrum. These elements are of the type of those used in the conventional NMR machines, and therefore do not require any additional detailed description.

Figure 2:
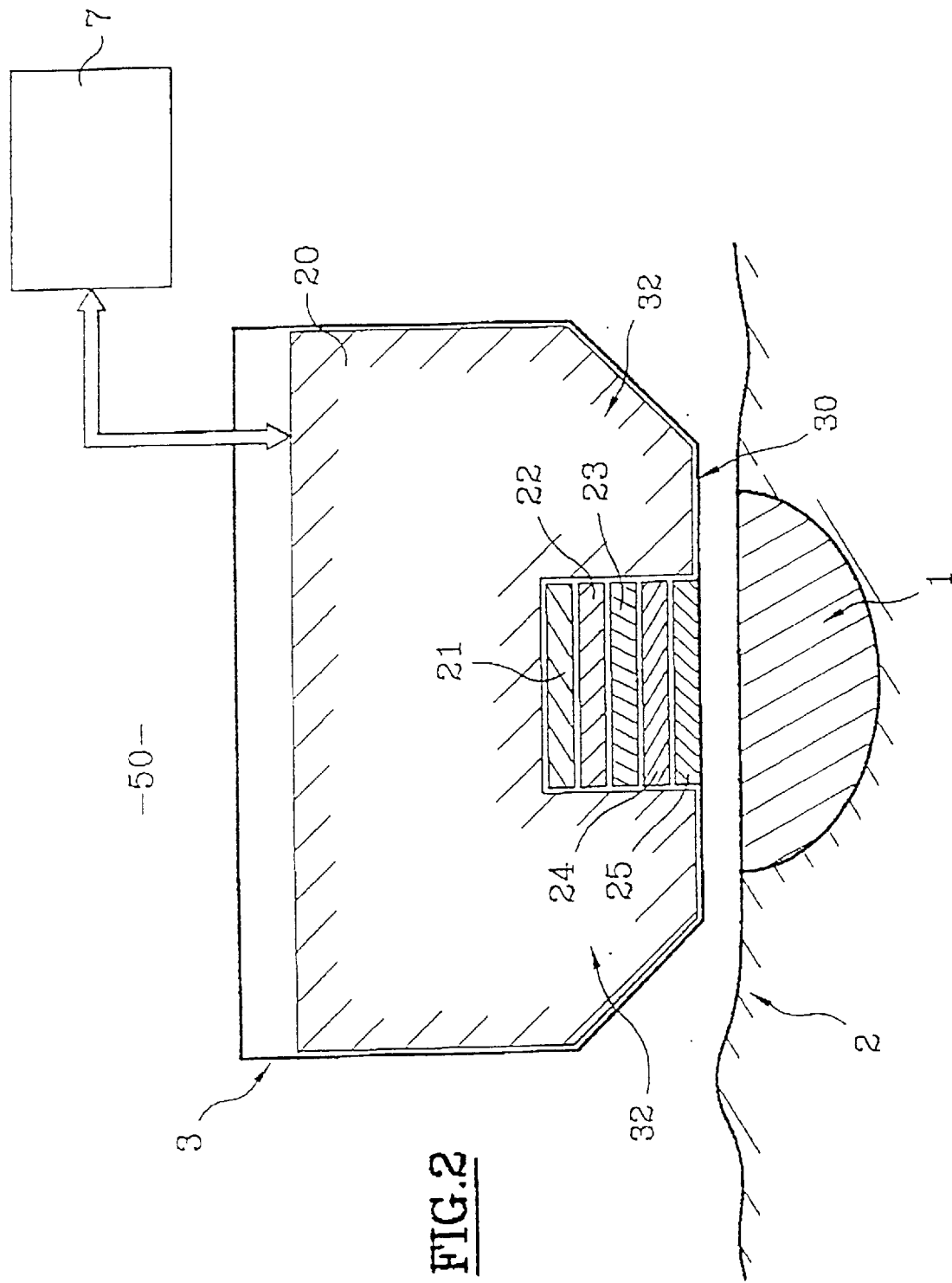
FIG. 2 illustrates a second embodiment of the device in accordance with the invention.
Figure 3:
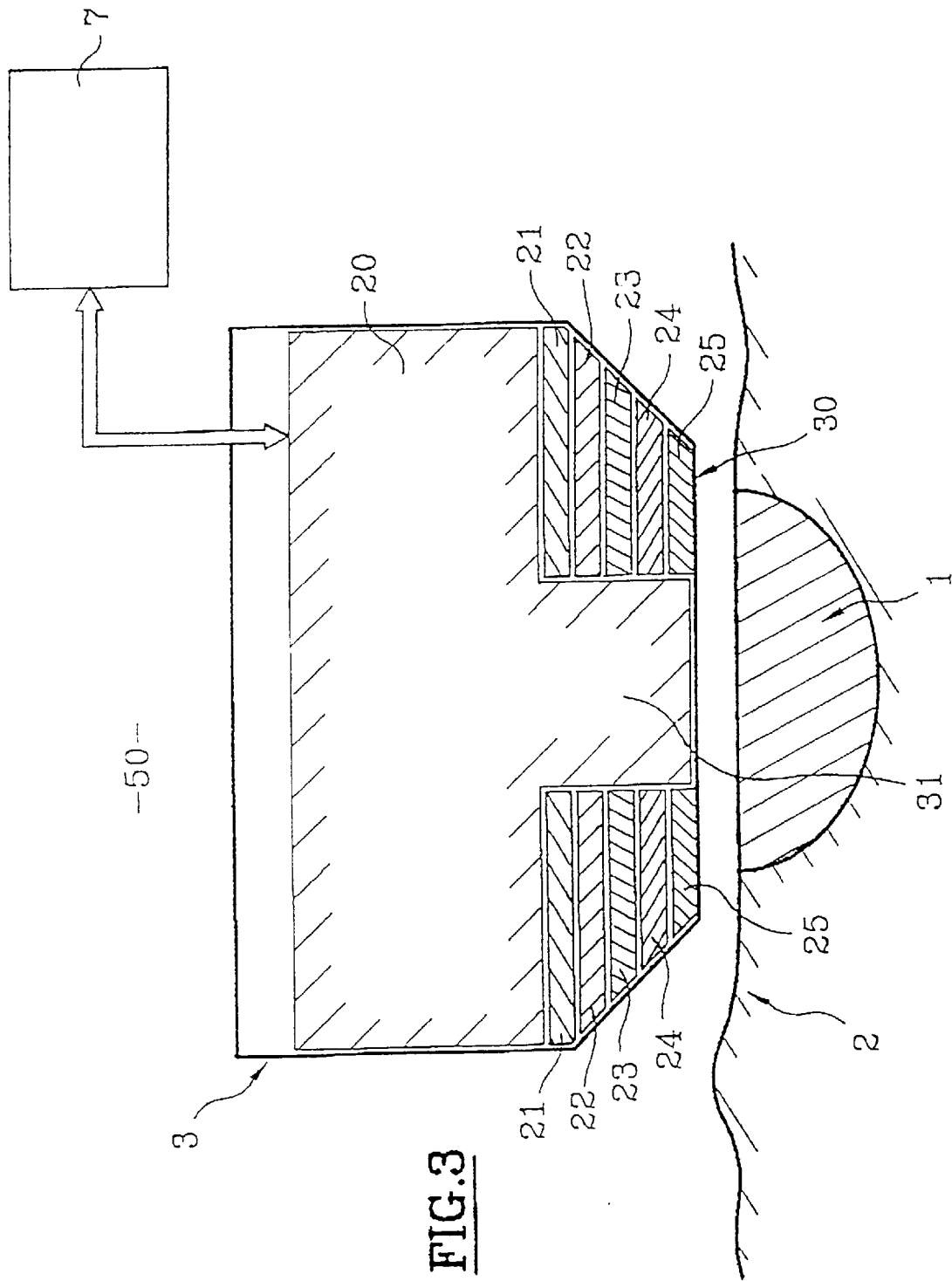
FIG. 3 illustrates a third embodiment of the device in accordance with the invention.

FIGS. 2 and 3 illustrate two other advantageous embodiments of the device 50 in accordance with the present invention. A magnet 20 permitting generation of the main magnetic field is designed so as to have a portion of its surface 31 directly opposite the zone to be examined 1. In the example of FIG. 2, the magnet 20 defines a central recessed portion within which the other elements (the shimming coil 21, the magnetic field gradient coils 22, 23, 24 and the radio frequency transmission/reception antennas 25) of the NMR device are disposed. In this way, the magnet is opposite the open surface over a peripheral zone 32 of the surface. In the example shown in FIG. 3, the magnet 20 has its central portion 31 directly opposite the zone to be examined 1. The other elements (the shimming coil 21, the field gradient coils 22, 23, 24 and the radio frequency transmission/reception antennas 25) of the NMR device are disposed all round, or on either side of, the central portion 31.

Figure 4:
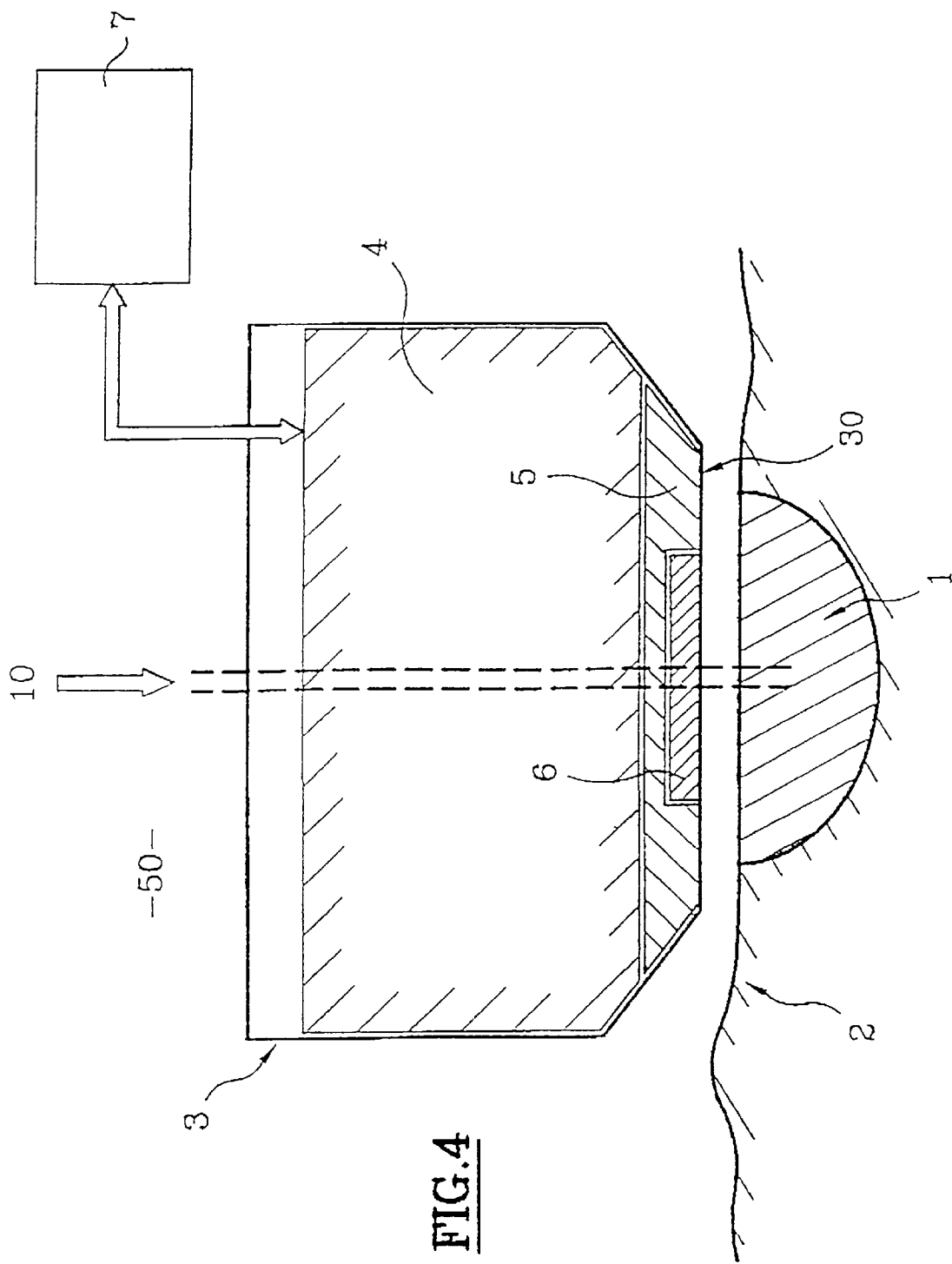
FIG. 4 illustrates a fourth embodiment of the device in accordance with the invention.

FIG. 4 shows a device 50 similar to that of FIG. 1, but wherein a duct 10 for instruments is arranged in the axis of the magnetic field system, thus enabling a surgeon to operate (to carry out a biopsy, for example), while having an image of the zone where the intervention is carried out. Such a characteristic may be envisaged in a similar manner in the devices of FIGS. 2 and 3.

Figure 5:
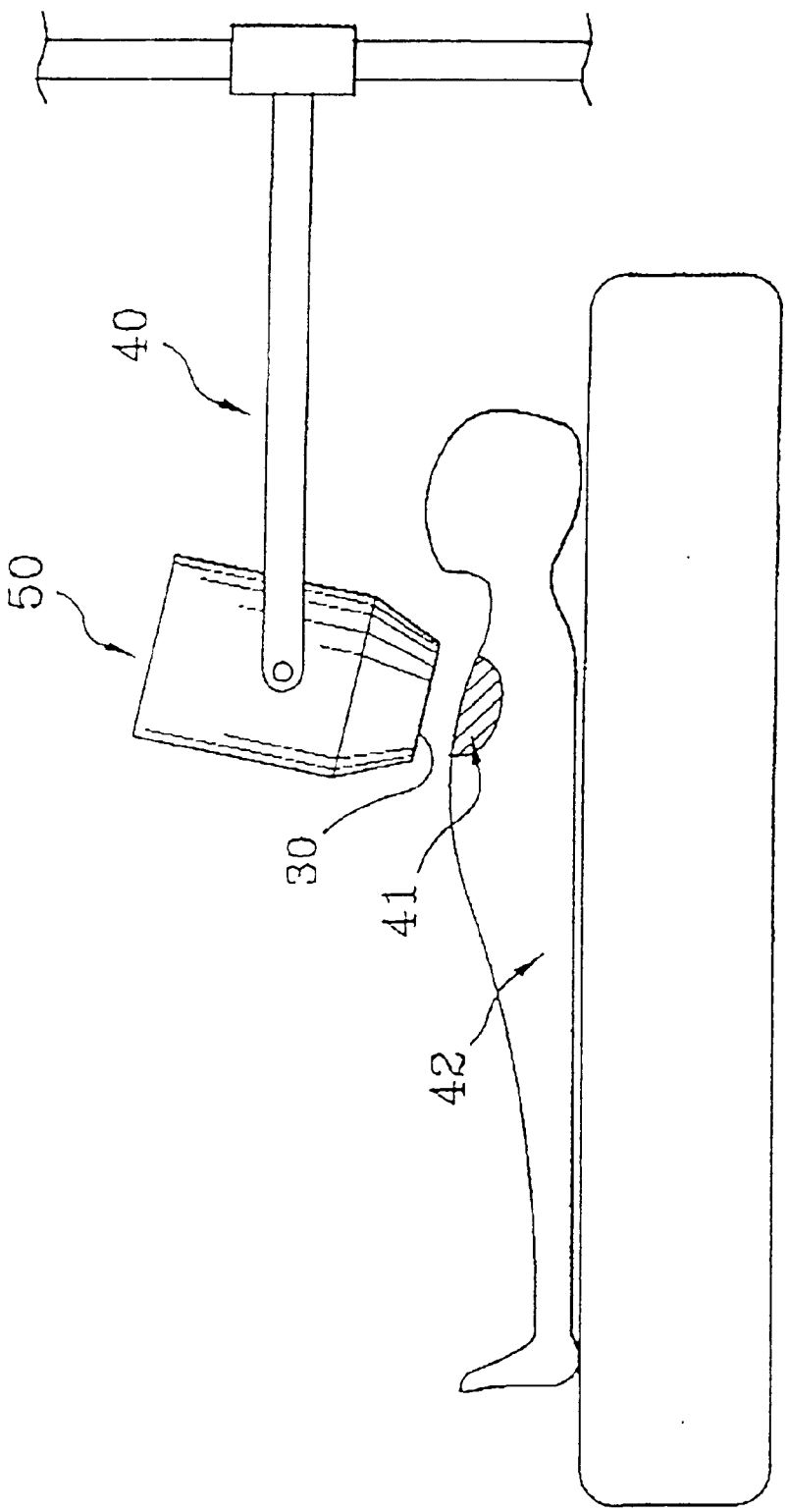
FIG. 5 illustrates a device in accordance with the present invention mounted on a manipulating system allowing the device to be brought adjacent a chosen zone.

FIG. 5 illustrates an important advantage of the device 50 in accordance with the present invention. Indeed, because of its compactness and its relatively small size and weight (typically less than 500 kg), the examination device can be mounted on a manipulating arm 40 so a physician can easily bring it directly opposite a zone 41 of a patient 42. The patient 42 is laid out on an examination table, thus making the examination more comfortable for both the patient and the medical practitioner. Because of its completely open structure, this type of apparatus is also particularly suitable for examining patients suffering from claustrophobia. In the same way, the examination device may be mounted on a fixed post, the patient being seated for example and being then moved relative to the device.

Portions of this invention may be conveniently implemented using a conventional general purpose digital computer or microprocessor programmed according to the teachings of the present specification, as will be apparent to those skilled in the computer art. Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium including instructions which can be used to program a computer to perform a process of the invention. The storage medium can include, but is not limited to, any type of disk including floppy disks, optical discs, CD-ROMs, and magneto-optical disks, ROMs, RAMs, EPROMs, EEPROMs, magnetic or optical cards, or any type of media suitable for storing electronic instructions.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A device for examining a volume by nuclear magnetic resonance, comprising:
    an open surface opposite the volume to be examined;
    means for creating a homogeneous static magnetic field $B_o$ within the volume to be examined, said magnetic field $B_o$ within the volume to be examined having a direction substantially parallel to said open surface;
    a field gradient system for creating magnetic field gradients in three directions of space; and
    a radio frequency transmission/reception system;
    wherein the means for creating the magnetic field $B_o$, the field gradient system, and the radio frequency transmission/reception system are situated on a same side of said open surface; and said volume to be examined is situated on another side of said open surface.

2. The device according to claim 1, further comprising a shimming system for improving homogeneity of the magnetic field $B_o$, said shimming system being positioned on said same side of the open surface remote from the volume to be examined.

3. The device according to claim 2, wherein said shimming system is formed by at least one of coils, ferromagnetic materials and small permanent magnets.

4. The device according to claim 1, wherein said means for creating a homogeneous static magnetic field comprises a permanent magnet.

5. The device according to claim 4, wherein said permanent magnet comprises a ferrite material.

6. The device according to claim 4, wherein said permanent magnet comprises an iron-rare earth alloy.

7. The device according to claim 6, wherein said iron-rare earth alloy is iron-neodymium-boron.

8. The device according to claim 4, wherein said permanent magnet comprises a mixture of a ferrite material and an iron-rare earth alloy.

9. The device according to claim 1, wherein said means for creating a homogeneous magnetic field comprises a resistive magnet formed by at least one of a copper and aluminium wire traversed by an electric current.

10. The device according to claim 1, wherein said means for creating a homogeneous magnetic field comprises a superconducting magnet.

11. The device according to claim 10, wherein said superconducting magnet is cooled by means of a helium cryostat.

12. The device according of claim 10, wherein said helium cryostat cools said superconducting magnet to a temperature of an order of 4° K.

13. The device according to claim 1, wherein said field gradient system includes an arrangement of three coils formed by an enamelled copper wire.

14. The device according to claim 1, wherein said field gradient system is in a form of a printed circuit.

15. The device according to claim 1, wherein said means for creating the magnetic field $B_o$ is at least in part directly opposite the volume to be examined.

16. The device according to claim 14, wherein said means for creating the magnetic field $B_o$ is directly opposite the volume to be examined over a central portion of said open surface.

17. The device according to claim 14, wherein said means for creating the magnetic field $B_o$ is directly opposite the volume to be examined over a peripheral portion of said open surface.

18. The device according to claim 1, further comprising a duct for gaining access to the volume to be examined and provided in an axis of the device and capable of allowing an instrument to pass.

19. The device according to claim 10, further comprising a duct for gaining access to the volume to be examined and provided in an axis of the device and capable of allowing an instrument to pass.

20. The device according to claim 13, further comprising a duct for gaining access to the volume to be examined and provided in an axis of the device and capable of allowing an instrument to pass.

* * * * *